(12) United States Patent
Wang et al.

(10) Patent No.: US 9,419,149 B2
(45) Date of Patent: Aug. 16, 2016

(54) SOLAR CELL SHEET AND HEAT TREATMENT PROCESS THEREOF

(75) Inventors: Hongfang Wang, Hebei (CN); Jingfeng Xiong, Hebei (CN); Zhiyan Hu, Hebei (CN); Gaofei Li, Hebei (CN); Haijiao An, Hebei (CN); Quanqing Yu, Hebei (CN); Wei Liu, Hebei (CN); Hao Lei, Hebei (CN)

(73) Assignee: YINGLI ENERGY (CHINA) COMPANY LIMITED, Baoding (CN)

( * ) Notice: Subject to any disclaimer, the term of this patent is extended or adjusted under 35 U.S.C. 154(b) by 0 days.

(21) Appl. No.: 14/348,052

(22) PCT Filed: Mar. 6, 2012

(86) PCT No.: PCT/CN2012/071967
§ 371 (c)(1),
(2), (4) Date: Mar. 28, 2014

(87) PCT Pub. No.: WO2013/044611
PCT Pub. Date: Apr. 4, 2013

(65) Prior Publication Data
US 2014/0224323 A1 Aug. 14, 2014

(30) Foreign Application Priority Data
Sep. 29, 2011 (CN) .......................... 2011 1 0301536

(51) Int. Cl.
*B29D 11/00* (2006.01)
*H01L 31/0216* (2014.01)
(Continued)

(52) U.S. Cl.
CPC ........ *H01L 31/02168* (2013.01); *H01L 31/028* (2013.01); *H01L 31/036* (2013.01);
(Continued)

(58) Field of Classification Search
CPC .. B60H 1/22; B60H 2001/2287; F04B 39/06; H01L 31/1864; H01L 31/028; H01L 31/1804; H01L 31/0216; H01L 31/02008; H01L 31/0202

USPC .............. 216/24, 26, 67, 79; 438/97, 98, 251, 438/719
See application file for complete search history.

(56) References Cited

U.S. PATENT DOCUMENTS 8,497,420 B2 * 7/2013 Carroll .................. B22F 1/0059
136/256
8,535,971 B2 * 9/2013 Pham .............. H01L 31/022425
136/256
(Continued)

FOREIGN PATENT DOCUMENTS

CN 1815760 A 8/2006
CN 101908577 A 12/2010
(Continued)

OTHER PUBLICATIONS

Martin A. Green, Solar Cell Efficiency Tables, 2006, Prog. Photovolt: Res. Appl.,14:45-51.*
(Continued)

*Primary Examiner* — Lan Vinh
(74) *Attorney, Agent, or Firm* — Kilpatrick Townsend & Stockton LLP

(57) ABSTRACT

Provided are a solar cell sheet and a heat treatment process thereof. The heat treatment process includes: a) sifting from solar cell sheets after printed and sintered cell sheets with conversion efficiency lower than 18% and filling factor thereof higher than 70%; b) performing low temperature annealing on the sifted cell sheets; c) sifting from the cell sheets after low temperature annealing cell sheets with lowered filling factor; d) re-sintering the sifted cell sheets; and e) sifting from the re-sintered cell sheets cell sheets with conversion efficiency lower than 18% and returning back to b) until most or all of the sifted meet demands. The low temperature annealing and re-sintering processes proceed cyclically, low temperature annealing can repair the defects in the substrate material, and the re-sintering process can repair the defects generated from low temperature annealing, and the two processes cooperate with each other and sifting can be performed repeatedly, greatly reducing the number of low efficient sheets and improving economic benefits.

9 Claims, 3 Drawing Sheets

(51) Int. Cl.
*H01L 31/18* (2006.01)
*H01L 31/028* (2006.01)
*H01L 31/036* (2006.01)
*H02S 50/10* (2014.01)

(52) U.S. Cl.
CPC ........ *H01L31/1804* (2013.01); *H01L 31/1864* (2013.01); *H02S 50/10* (2014.12); *Y02E 10/547* (2013.01); *Y02P 70/521* (2015.11)

(56) References Cited

U.S. PATENT DOCUMENTS

| | | |
|---|---|---|
| 2005/0189015 A1 | 9/2005 | Rohatgi et al. |
| 2005/0252544 A1 | 11/2005 | Rohatgi et al. |
| 2009/0101202 A1* | 4/2009 | Sun .................... H01L 31/1804 136/256 |
| 2010/0233840 A1* | 9/2010 | Rohatgi .......... H01L 31/022425 438/72 |
| 2011/0108098 A1* | 5/2011 | Kapur ............. H01L 31/022425 136/255 |

FOREIGN PATENT DOCUMENTS

| | | |
|---|---|---|
| CN | 102185008 A | 9/2011 |
| CN | 102185033 A | 9/2011 |
| CN | 102315332 A | 1/2012 |
| JP | 01-124270 A | 5/1989 |
| JP | 2001036114 A | 2/2011 |
| JP | 2011129867 A | 6/2011 |

OTHER PUBLICATIONS

Effect of hydrogen annealing on the performance of polycrystalline silicon thin film solar cells.
International Search Report for PCT/CN2012/071967.
T. Bao et al: "Recent Advances in Thermal Processing for c-Si Solar Cell Manufacturing", ECS Transactions, 2010, pp. 995-1000, XP055192274, ISSN: 1938-5862, DOI: 10.1149/1.3360741.
The European Search Report issued on Jun. 10, 2015 regarding a European counterpart application (12837273).
Ebong Abasifreke et al., Capitalizing on the Glass-Etching Effect of Silver Plating Chemistry to Contact Si Solar Cells With Homogeneous 100-110 Ω/sq Emitters, IEEE Electron Device Lett,, Jun. 2011,vol. 32, No. 6, p. 779-781.
Wolf Andreas et al., Pilot Line Processing of 18.6% Efficient Rear Surface Passivated Large Area Solar Cells, Conf Rec IEEE Photovoltaic Spec Conf, The Year of 2010, vol. 35th, vol. 2, p. 1014-1018.
Kim Dong Seop et al., Ribbon Si solar cells with efficiencies over 18 % by hydrogenation of defects, Sol Energy Mater Sol Cells, May 23, 2006, vol. 90, No. 9, p. 1227-1240.
The first Office Action issued on Mar. 31, 2015 regarding a Japanese counterpart application.

* cited by examiner

(12)  United States Patent  US 9,419,149 B2

SOLAR CELL SHEET AND HEAT TREATMENT PROCESS THEREOF

This application is the national phase of International Application No. PCT/CN2012/071967, titled "SOLAR CELL SHEET AND HEAT TREATMENT PROCESS THEREOF", filed on Apr. 4, 2013, which claims the priority to Chinese Patent Application No. 201110301536.3, entitled "SOLAR CELL SHEET AND HEAT TREATMENT PROCESS THEREOF", filed with the Chinese Patent Office on Sep. 29, 2011, which are hereby incorporated by reference in their entirety.

FIELD

The present invention relates to the field of production and processing of solar cells, and particularly, to a solar cell sheet and a heat treatment process thereof.

BACKGROUND

A solar cell, which is also referred to as a photovoltaic cell, is a semiconductor device converting solar energy into electrical energy. In the situation of energy shortage today, the solar cell is with great prospect, because the solar cell is a green product which causes no environmental pollution and the solar energy is a renewable resource. Currently, eighty percent or more of the solar cells are made from crystalline silicon (monocrystalline silicon and polycrystalline silicon). Therefore, the manufacture of a crystalline silicon solar cell with a high efficiency is of great significance in generating electricity in a large scale by using the solar energy.

Currently, the manufacturing process for the crystalline silicon solar cell has been standardized, which mainly includes the following steps S11 to S16.

The step S11 is to perform chemical cleaning on a surface of a silicon sheet and to perform surface texturing (i.e., surface flocking). An uneven structure is formed, by chemical reaction, on the surface of the silicon sheet which is smooth originally to enhance the absorption of light.

The step S12 is to perform diffusion to form a junction. A P-type (or N-type) silicon sheet is placed into a diffusion furnace, N-type (or P-type) impurity atoms come into contact with a surface of the silicon sheet, penetrate and diffuse into the silicon sheet via gaps between silicon atoms, and accordingly a P-N junction is formed. Electrons and holes may no longer return to where they come from after flowing and a current is consequently generated, that is, the silicon sheet has a photovoltaic effect. The diffusion concentration, the depth of the junction and the uniformity of the diffusion affect electrical properties of the solar cell. A total amount of the impurity diffused into the silicon sheet is measured by sheet resistance. The smaller the total amount of the impurity is, the greater the sheet resistance is, and the lower the conversion efficiency is. For a conventional P-type crystalline silicon solar cell, a diffusion process is merely performed on a front surface of the cell to form the junction. For N-type crystalline silicon solar cell, the diffusion process is also performed on a back surface of the cell to form a back surface field. The P-type crystalline silicon includes P-type monocrystalline silicon and P-type polycrystalline silicon. Similarly, the N-type crystalline silicon includes N-type monocrystalline silicon and N-type polycrystalline silicon.

The step S13 is to perform a plasma etching at the periphery of the silicon sheet to remove a conductive layer which is formed at the edge of the silicon sheet during the diffusion process and would cause a short circuit of the P-N junction.

The step S14 is to perform flat-plate type Plasma Enhanced Chemical Vapor Deposition (PECVD), i.e., to deposit an antireflection film. The antireflection film mainly includes silicon nitride film, silicon oxynitride film and/or titanium nitride film. The reflection of light is reduced by using thin film interference principle, an effect of passivation is caused, a short-circuit current and an output power of the cell are increased, and the conversion efficiency is improved.

The step S15 is to print electrodes. For the conventional P-type crystalline silicon solar cell, usually, a front electrode and a back electrode are printed by using silver paste and a back surface field is printed by using aluminum paste, to collect current and conduct electricity. For the N-type crystalline silicon solar cell, usually, the back surface field is formed during the diffusion process.

The step S16 is to perform sintering. An alloy is formed between printed metal electrodes and the silicon sheet at high temperature, that is, good ohmic contacts are formed between contact surfaces. Accordingly, a series resistance of the cell is reduced, and an output voltage and an output current of the cell are raised. Therefore, the forming of the good ohmic contacts has an important influence on the conversion efficiency of the whole cell.

In the practical manufacturing process, it is found that a certain percentage of cell sheets manufactured with the above approach may have a low conversion efficiency. Here, the solar cell sheet with the conversion efficiency lower than 18 percent is regarded as a substandard inefficient sheet or an inefficient sheet. In existing technologies, the inefficient sheet is sifted out through a sorting test, and packaged and stored as a substandard inefficient product. The conversion efficiency of the solar cell is not fully exploited with the above processing approach, and accordingly the economic benefit is reduced.

SUMMARY

A solar cell sheet and a heat treatment process thereof are provided in the disclosure, a photoelectric conversion efficiency of the cell sheet is further improved and accordingly economic benefit is improved.

To achieve the above object, the following technical solution is provided in the disclosure.

A heat treatment process for solar cell sheets is provided. The heat treatment process includes:

a) sifting out, from solar cell sheets on which printing and sintering are performed, cell sheets with conversion efficiencies lower than 18 percent and filling factors higher than or equal to 70 percent;

b) performing low temperature annealing on the sifted cell sheets to improve the conversion efficiencies of the sifted cell sheets, where a temperature for the low temperature annealing is lower than that of a normal sintering;

c) performing a sorting test on the cell sheets, on which the low temperature annealing is performed, to sift out the cell sheets for which the filling factors are decreased;

d) re-sintering the cell sheets sifted out in step c) to improve the filling factors of the cell sheets, where a temperature for the re-sintering is same as that of the normal sintering; and e) performing a sorting test on the re-sintered cell sheets to sift out the cell sheets with the conversion efficiencies lower than 18 percent and returning to step b), until most or all of the sifted cell sheets have the conversion efficiencies higher than 18 percent and have the filling factors higher than or equal to 70 percent.

Bases of the cell sheets may be made of monocrystalline silicon, and the sifted cell sheets may be solar cell sheets with low conversion efficiencies due to defects introduced in a process of drawing the monocrystalline silicon.

Before the printing and sintering, the heat treatment process may further include: a flocking process on surfaces of the cell sheets, a diffusion process for forming junctions and a plasma etching process at peripheries of the cell sheets. The diffusion process for forming junctions includes: performing diffusion on front surfaces of the cell sheets to form the junctions and performing diffusion on back surfaces of the cell sheets to form back surface fields.

After the plasma etching process at the peripheries of the cell sheets, the heat treatment process may further include: an antireflection film depositing process and an electrode printing process. The antireflection film depositing process includes successively depositing antireflection films on both the front surfaces and the back surfaces of the cell sheets.

The bases for manufacturing the cell sheets may be made of N-type monocrystalline silicon.

A duration for the low temperature annealing may range from 30 seconds to 4 minutes.

The temperature for the low temperature annealing may range from 250 Celsius degrees to 550 Celsius degrees.

The antireflection film may include at least one of hydrogen-rich silicon nitride thin film, hydrogen-rich silicon oxynitride thin film, and hydrogen-rich titanium nitride thin film.

The low temperature annealing process may be performed in a non-oxidizing atmosphere.

A solar cell sheet manufactured with the above described process is further provided according to an embodiment of the disclosure. The solar cell sheet has a conversion efficiency higher than or equal to 18 percent and has a filling factor higher than or equal to 70 percent.

A base of the solar cell sheet may be made of monocrystalline silicon, and a hydrogen-rich antireflection film is provided on both a front surface and a back surface of the cell sheet.

As compared with the prior art, the above technical solution has the following advantages:

With he solar cell sheet and the heat treatment process thereof provided according to embodiments of the disclosure, the solar cell sheets with low conversion efficiencies are sifted out, and the low temperature annealing is performed on the sifted cell sheets, i.e., a re-sintering process is performed. Since the low conversion efficiencies of the sifted cell sheets are due to defects introduced during a process of manufacturing silicon bases, these defects can not be completely eliminated in the manufacturing process for the solar cell sheets. However, according to the embodiments, the re-sintering is performed at a temperature lower than that of the normal sintering and lasts for a duration shorter than that of the normal sintering, elements with a function of passivation (mainly hydrogen) in the antireflection films may accordingly further passivate the defects in the material of the bases, that is, the defects in the material of the bases may be further reduced, and consequently the conversion efficiencies of the crystalline silicon solar cells are improved.

After the low-temperature annealing, since properties of the vitreous in gate lines of the cell sheet may change due to the low temperature annealing process, the filling factors may be reduced, and accordingly the conversion efficiencies of the cell sheets may be affected in turn. Therefore, the cell sheets for which the filling factors are decreased are re-sintered at a normal sintering temperature to improve the filling factors of the cell sheets.

The low-temperature annealing process and re-sintering process are performed circularly. The defects in monocrystalline silicon and polycrystalline silicon base materials can be repaired during the low-temperature annealing, and the defects generated during the low temperature annealing process can be repaired during the re-sintering process. The low-temperature annealing process and the re-sintering process cooperate with each other. The cell sheets with the conversion efficiencies higher than 18 percent and the filling factors higher than or equal to 70 percent may be obtained after each process, and the remaining cell sheets that do not meet the requirements are further processed. The processes repeat in this way. The conversion efficiencies and the filling factors of most or all of the sifted cell sheets may meet the requirements via the sifting, re-sintering and other processes performed step by step. That is, the quantity of inefficient sheets is reduced greatly, and accordingly the economic benefit is improved.

BRIEF DESCRIPTION OF THE DRAWINGS

Drawings are used to make the above and other objects, features and advantages of the disclosure clearer. Throughout the drawings, same reference numerals indicate same parts. The drawings are not drawn to scale and are aimed at illustrating the subject matter of the disclosure.

DETAILED DESCRIPTION OF THE EMBODIMENTS

To make the above objects, features and advantages of the disclosure more obvious and understandable, embodiments of the disclosure are described in detail hereinafter in conjunction with drawings.

For fully understanding the disclosure, many details are set forth in the following description. However, the disclosure may be implemented in other manners than those described herein, and similar extensions may be made by those skilled in the art without deviating from the spirit of the disclosure. Therefore the disclosure is not limited to the embodiments disclosed hereinafter.

As described in the background, conventionally a certain amount of inefficient sheets may be manufactured after the sintering process. The inventors find though study that there are many causes for low conversion efficiencies of cell sheets. However, most of the inefficient sheets generally have one common characteristic, that is, various defects may occur after the sintering process. Through further detection on structures and morphologies of these defects, it is found that these defects are caused by defects in monocrystalline silicon and polycrystalline silicon base materials. For example, in the monocrystalline silicon base material, there exist defects such as Oxidation-induced Stacking Fault (OSF) ring and gap or swirl of vacancy duster, and in the polycrystalline silicon base material, there exist defects such as grain boundary, dislocation, etc. These defects, for example, an annular defect or a dirty defect occurs on the cell sheet after sintering because of the defects of the monocrystalline silicon base material, can not be completely eliminated through one sintering process. The poor electrical conductivity due to the defects may result in the low conversion efficiency of the cell sheet.

Figure 1:
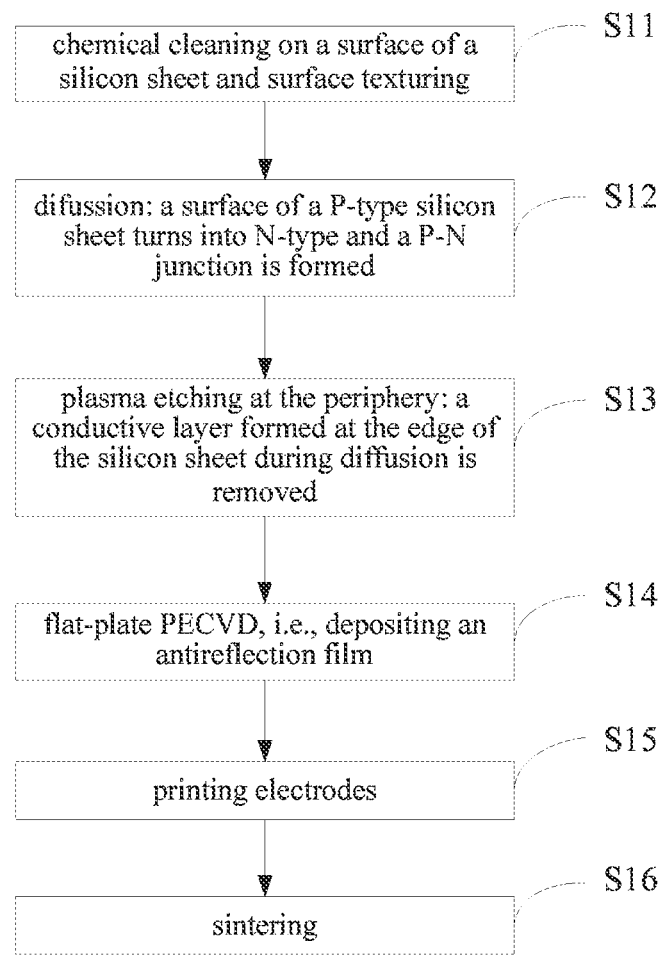
FIG. 1 is a flowchart of a heat treatment process for crystalline silicon solar cells in the prior art.
Figure 2:
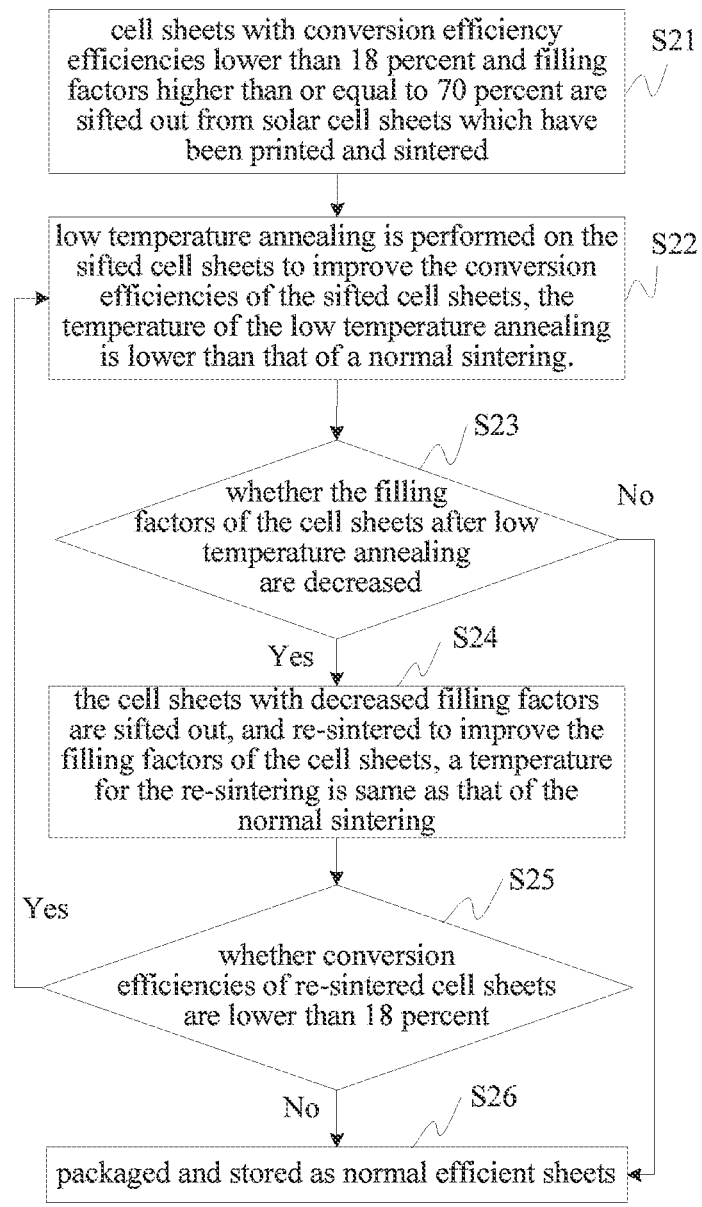
FIG. 2 is a flowchart of a heat treatment process for solar cell sheets according to an embodiment of the disclosure.

Accordingly, a heat treatment process for solar cell sheets is provided according to an embodiment of the disclosure. A flowchart of the heat treatment process is shown in FIG. 2. The heat treatment process includes the following steps S21 to S26.

In the step S21, cell sheets with conversion efficiencies lower than 18 percent and filling factors higher than or equal to 70 percent are sifted out from solar cell sheets which have been printed and sintered. Most of the cell sheets with low conversion efficiencies have annular defects or dirty defects, which are mainly caused by defects in base materials. For example, in the case that the cell sheets are made from polycrystalline silicon, the defects of the cell sheets are mainly caused by grain boundaries and dislocations in the polycrystalline silicon bases. In the case that the cell sheets are made from monocrystalline silicon, the defects of the cell sheets are mainly caused by Oxidation-induced Stacking Faults (OSF) ring(s) and gap(s) introduced when drawing the monocrystalline silicon, or by swirl defects of vacancy clusters. These defects in the base materials can not be eliminated through a common manufacture process for the solar cell sheets.

In normal circumstances, the conversion efficiencies of the cell sheets with filling factors higher than or equal to 70 percent may not be too low, and usually are in an acceptable range. However, these cell sheets may have low conversion efficiencies due to the defects present in silicon bases and so on. Thus, the sifted cell sheets according to the embodiment are mainly the cell sheets with the filling factors higher than or equal to 70 percent and the conversion efficiencies lower than 18 percent. And antireflection films deposited on the cell sheets are mainly hydrogen-rich silicon nitride thin films or hydrogen-rich silicon oxynitride thin films.

In the step S22, low temperature annealing is performed on the sifted cell sheets to improve the conversion efficiencies of the sifted cell sheets. The temperature of the low temperature annealing is lower than that of a normal sintering. The low temperature annealing process may be performed in a non-oxidizing atmosphere such as a nitrogen or hydrogen atmosphere. The atmosphere for the low temperature annealing process is not limited in the embodiment, and the process solution may be controlled flexibly.

It is found by the inventors through study that, among a variety of inefficient solar cell sheets, the conversion efficiencies of the cell sheets with high filling factors and low conversion efficiencies may be improved to a certain extent after the low temperature annealing, with the temperature for the low temperature annealing being lower than that of the normal sintering. In such a low temperature annealing, hydrogen in the antireflection films may further deeply enter the base materials. Thus the defects in silicon base materials may further be passivated, Voc and Isc are increased, and accordingly, the conversion efficiencies are improved.

In the normal manufacturing process for the cell sheets, the defects present in the silicon base materials may be eliminated through the sintering process. However, for some silicon base materials, too many defects are introduced during the manufacturing process, and the defects in the base materials may not be completely eliminated merely through one normal sintering, and accordingly some inefficient sheets arise. According to the embodiment, the low temperature annealing process is performed on the cell sheets with low conversion efficiencies due to the defects in the base materials, the defects in the silicon bases may further be passivated by hydrogen in the antireflection films (hydrogen-rich silicon nitride films or hydrogen-rich silicon oxynitride films). Therefore the Voc and Isc are increased, and accordingly the conversion efficiencies are improved.

Since the annealing process is performed after the normal sintering process, according to the embodiment of the disclosure, the temperature for the low temperature annealing is lower than that of the normal sintering to ensure the basic performance of the cell sheets. Furthermore, the annealing process is simultaneously performed on both front surfaces and back surfaces of the cell sheets, and for the polycrystalline silicon cell sheets, the melting point of silver paste is much higher than that of aluminum paste. Therefore, for the polycrystalline silicon cell sheets, the annealing temperature needs to be lower than the melting point of aluminum so as not to affect the smoothness of aluminum back surface fields. For the monocrystalline silicon cell sheets, back surface fields are formed during the diffusion process, therefore, the annealing temperature should not be too high in order not to affect properties of gate lines of the cell sheets.

According to this embodiment, the temperature for the low temperature annealing is preferably below 600 Celsius degrees, and more preferably in a range from 250 Celsius degrees to 550 Celsius degrees. A duration for the low temperature annealing ranges from 30 seconds to 4 minutes. Specific annealing time may be determined based on the defects of the cell sheets, the more the defects are, the longer the annealing time is.

In the step S23, after the low temperature annealing, a sorting test is performed on the cell sheets to sift out cell sheets for which the filling factors are decreased. For cell sheets for which the filling factors are not decreased and the conversion efficiencies are higher than 18 percent, the procedure proceeds to the step S26, in which the cell sheets are packaged and stored as normal efficient sheets.

In the practical manufacturing process, it is found that, after the low temperature annealing process, the filling factors and conversion efficiencies of most of the cell sheets are improved, and accordingly these cell sheets are no longer inefficient sheets. However, the filling factors of minority of the cell sheets may be decreased. The conversion efficiencies of these cell sheets may be improved due to the decrease of the filling factors, while the improvement is limited, and the conversion efficiencies of most of these cell sheets are still low.

The inventors find through study that the decrease of the filling factors in the annealing process mainly ascribes to the fact that the conductive materials in the gate lines are volatilized during the low temperature annealing process, the vitreous in the gate lines are not corrosive and the conductivity turns poor, and accordingly, series resistances become higher and the filling factors are decreased. Furthermore, the Voc and Isc are significantly increased during the low temperature annealing process, which may also cause the decrease of the filling factors to some extent. The decrease of the filling factors inevitably affects the conversion efficiencies of the cell sheets, thus these cell sheets must be processed.

In the step S24, the cell sheets sifted in step S23 are re-sintered to improve the filling factors of the cell sheets. A temperature for the re-sintering is same as that of the normal sintering.

In the step, the cell sheets for which the filling factors are significantly decreased and the conversion efficiencies are lower than 18 percent after the low temperature annealing process are re-sintered. Parameters of the re-sintering process are same as those of the normal sintering process. After this step, the defects occurred during the low temperature annealing process are repaired, and the filling factors of the cell sheets are increased. However, after the re-sintering in this step, hydrogen in the antireflection films, which has a function of passivation, may partially overflow; and the defects in the base materials may be regenerated. Therefore, the Voc and Isc may be decreased after the step, that is, the conversion efficiencies are decreased. Nevertheless, this problem may only occur occasionally, and it may be determined whether or not to perform the next step(s) based on the quantity of the cell sheets with the defects. According to the embodiment of the disclosure, only the case that the next step should be performed is described.

In the step S25, a sorting test is performed on the re-sintered cell sheets to sift out the cell sheets with the conversion efficiencies lower than 18 percent, i.e., to sift out the cell sheets for which the Voc and Isc are decreased, and the steps S22 to S24 are repeated until most or all of the sifted cell sheets have the conversion efficiencies higher than 18 percent and the filling factors higher than or equal to 70 percent.

After each step, for the sifted cell sheets with the filling factors higher than or equal to 70 percent and the conversion efficiencies higher than 18 percent, the procedure proceeds to the step S26, in which the cell sheets are packaged and stored as normal efficient sheets. In the practical manufacturing process, basically, the conversion efficiencies and the filling factors of most of the cell sheets may meet the requirements through one procedure of low-temperature annealing, re-sintering and low temperature annealing again.

According to the embodiment, the solar cell sheets with low conversion efficiencies are sifted out, the low temperature annealing is performed on the sifted cell sheets, and accordingly, the defects generated during the normal sintering process may be improved. However, after the low temperature annealing, the problem that the filling factors are decreased may occur. The cell sheets for which the filling factors are decreased are re-sintered at a normal sintering temperature to increase the filling factors of the cell sheets.

According to the embodiment, the low-temperature annealing process and the re-sintering process are performed circularly. The defects generated during the normal sintering process can be repaired via the low-temperature annealing process, and the defects generated during the low temperature annealing process can be repaired via the re-sintering process. The low-temperature annealing process and the re-sintering process cooperate with each other. The cell sheets with conversion efficiencies higher than 18 percent and filling factors higher than or equal to 70 percent may be obtained after each process, and the remaining cell sheets that do not meet be requirements are further processed. The processes repeat in this way. The conversion efficiencies and the filling factors of most or all of the sifted cell sheets may meet the requirements via the sifting, re-sintering and other processes performed step by step. That is, the quantity of the inefficient sheets is reduced greatly, and accordingly the economic benefit is improved.

It should be noted that the heat treatment process for the solar cell sheets according to the embodiment may be applied to the solar cell sheets manufactured with base materials of N-type or P-type monocrystalline silicon and N-type or P-type polycrystalline silicon, and the conversion efficiencies of all the cell sheets can be improved. According to the following embodiment, the main idea and advantages of the embodiment of the disclosure are further described by taking the case that the base materials of the solar cell sheets are N-type crystalline silicon, preferably N-type monocrystalline silicon, as an example.

Figure 3:
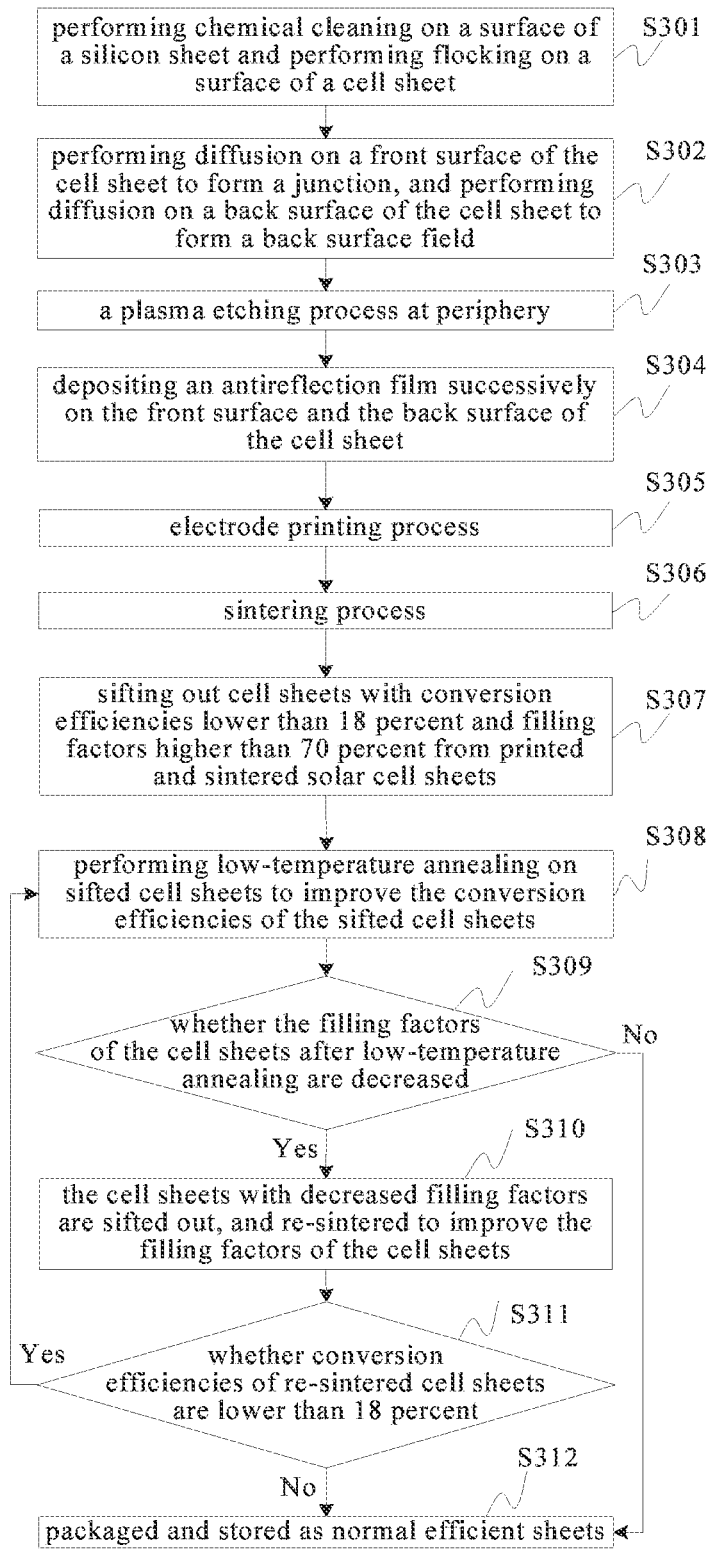
FIG. 3 is a flowchart of a heat treatment process for solar cell sheets according to another embodiment of the disclosure.

A flowchart of a heat treatment process for solar cell sheets according to another embodiment of the disclosure is shown in FIG. 3. Different from the above embodiment, according to this embodiment, the above described method is further improved by taking the case that the base of the solar cell sheet is made of N-type crystalline silicon, preferably N-type monocrystalline silicon, as an example. The heat treatment process for the solar cell sheets according to the embodiment includes the following steps.

The step S311 is to perform chemical cleaning on a surface of a silicon sheet and perform flocking on a surface of a cell sheet. In the step, the flocking needs to be performed on both a front surface and a back surface of the cell sheet to enhance the absorption of light.

The step S312 is to perform diffusion on the front surface of the cell sheet to form a junction. Diffusion is successively performed on both the front surface and the back surface of the cell sheet to form the junction and a back surface field.

It should be noted that usually a P-type silicon sheet is adopted in the conventional manufacturing process of the solar cell, and then N-type impurity atoms are diffused to form a P-N junction. In contrast, according to the embodiment, an N-type silicon sheet is adopted and then P-type impurity atoms are diffused to form a P-N junction. In the manufacturing process for a conventional P-type crystalline silicon solar cell, the diffusion is merely performed on the front surface of the cell sheet to form the junction. However, according to the embodiment, N-type monocrystalline silicon is used as the base material, therefore, after diffusion is performed on the front surface of the cell sheet to form the junction, diffusion is also performed on the back surface of the cell sheet to form the back surface field. Accordingly, the sheet resistance of the silicon sheet is further decreased, which provides a basis for improving a conversion efficiency of the cell sheet.

The step S313 is to perform a plasma etching at periphery of the silicon sheet to remove a conductive layer which is formed at the edge of the silicon sheet during the diffusion process and would cause a short circuit of the P-N junction.

The step S314 is to deposit an antireflection film. The antireflection film mainly includes at least one of silicon nitride film, silicon oxynitride film and titanium nitride film. The reflection of light is reduced by using thin film interference principle, the carrier recombination is reduced as well, and accordingly an effect of passivation is caused. A short-circuit current and an output power of the cell are increased, and the conversion efficiency is improved.

Conventionally, the antireflection film is merely deposited on the front surface of the cell sheet. By contrast, according to the embodiment, the antireflection film depositing is successively performed on both the front surface and the back surface of the cell sheet, and accordingly the area of the antireflection film is increased. The content of hydrogen having a function of passivation is increased; hence, defects in a monocrystalline silicon base material may be further passivated, and the reflection of light may be further reduced. In addition, the back surface of the cell sheet is also passivated, and accordingly the conversion efficiency of the cell sheet is further improved.

It should be noted that, although the process of depositing antireflection film on both the front surface and the back surface of the cell sheet is merely explained with an example of N-type monocrystalline silicon, the process is not limited to N-type monocrystalline silicon or N-type polycrystalline silicon. The process may also be applied to P-type crystalline silicon in theory. However, since different approaches are used to form back surface fields for the N-type crystalline silicon and the P-type crystalline silicon, in the practical manufacturing process, the conversion efficiencies of the crystalline, silicon solar cells with different doping types are of different improvements by the process of depositing antireflection film on both the front surface and the back surface of the cell sheet. In general, the improvement of the conversion efficiency of the N-type crystalline silicon solar cell is greater, while the improvement of the conversion efficiency of the P-type crystalline silicon solar cell is smaller.

In addition, it should be noted that, according to the embodiment, the antireflection film includes at least one of hydrogen-rich silicon nitride thin film, hydrogen-rich silicon oxynitride thin film, and hydrogen-rich titanium nitride thin film in order to achieve a good effect of passivation. According to the embodiment, preferably, the antireflection film is the hydrogen-rich silicon nitride thin film.

The step S315 is to print electrodes. In the step, only silver paste is used to print a front electrode and a back electrode to collect current and conduct electricity.

The step S316 is to perform sintering to form an alloy between the printed metal electrodes and the silicon sheet at high temperature.

Then the procedure proceeds to steps S317 to S316, in which the sintered cell sheets are sifted and reprocessed. These processes are same as those according to the former embodiment, and are not further described here.

According to the embodiment, diffusion is performed on the front surface of the cell sheet to form the junction and diffusion is performed on the back surface of the cell sheet to form the back surface field. The antireflection film depositing process is performed on both the front surface and the back surface of the cell sheet. Since the content of hydrogen is raised, the effect of passivation of hydrogen in the antireflective film is more significant. That is, the defects in the monocrystalline silicon base material are further reduced, and the conversion efficiency of the N-type monocrystalline silicon solar cell sheet is further improved. In a normal procedure for drawing a monocrystalline silicon rod, defects such as Oxidation-induced Stacking Fault (OSF) ring(s) and gap(s), swirl of vacancy cluster, a large content of oxygen impurity or the like may be introduced. By virtue of repeated processes of low-temperature annealing, re-sintering, low temperature annealing and the like, and by virtue of the antireflection film provided on both the front surface and the back surface, the defects in the N-type monocrystalline silicon base material may be further passivated, that is, various structural defects in the monocrystalline silicon base material are improved. Voc and Isc of the cell sheet made from N-type monocrystalline silicon are increased, and accordingly the conversion efficiency of the cell sheet is improved.

The effect of the heat treatment process for the solar cell sheets according the embodiment of the disclosure is illustrated hereinafter with specific experimental data of the N-type monocrystalline silicon solar cells before and after the method according the embodiment is performed.

Five batches of N-type monocrystalline silicon solar cell sheets made from same materials and with the same specification are chosen. A Hydrogen-rich antireflection film is provided on both the from surface and the hack surface of each one of these cell sheets. After the normal manufacturing process, the five batches of solar cells are tested and graded. 200 cell sheets with the conversion efficiencies lower than 18 percent and the filling factors higher than or equal to 70 percent are sifted out from each batch. Electrical parameters of the sifted cell sheets are tested to obtain average electrical parameters of each batch of the cell sheets. Test results are shown in Table 1.

TABLE 1 table listing the electrical parameters of batches of inefficient sheets numbered 1-5 after the normal sintering process

| Batch number of the cell sheets | Open-circuit voltage Voc (volt) | Short-circuit current Isc (ampere) | Series resistance Rs (ohm) | Filling Factor FF (%) | Conversion efficiency Ncell (%) |
|---|---|---|---|---|---|
| 1 | 0.5827 | 7.826 | 0.0025 | 78.57 | 14.99 |
| 2 | 0.5604 | 7.401 | 0.0026 | 77.58 | 13.46 |
| 3 | 0.5941 | 8.234 | 0.0023 | 76.57 | 15.68 |
| 4 | 0.6032 | 8.757 | 0.0026 | 77.73 | 17.18 |
| 5 | 0.6102 | 8.647 | 0.0024 | 78.46 | 17.32 |

The low temperature annealing is performed on the sifted cell sheets. During the annealing process, the temperature in the sintering furnace is controlled in a range from 250 Celsius degrees to 550 Celsius degrees, and the annealing time is controlled in a range from 30 seconds to 4 minutes. The cell sheets after low-temperature annealing are tested, and the test results are shown in Table 2.

TABLE 2 table listing the electrical parameters of the batches of inefficient sheets numbered 1-5 after the low temperature annealing

| Batch number of the cell sheets | Open-circuit voltage Voc (volt) | Short-circuit current Isc (ampere) | Series resistance Rs (ohm) | Filling Factor FF (%) | Conversion efficiency Ncell |
|---|---|---|---|---|---|
| 1 | 0.6360 | 8.915 | 0.0037 | 77.30 | 18.34 |
| 2 | 0.6420 | 9.137 | 0.0027 | 76.81 | 18.85 |
| 3 | 0.6406 | 9.074 | 0.0018 | 77.69 | 18.90 |
| 4 | 0.6365 | 9.155 | 0.0079 | 71.17 | 17.35 |
| 5 | 0.6402 | 9.077 | 0.0105 | 69.44 | 16.89 |

As can be found from the table above, after the annealing process, for the cell sheets in the batch numbered 1, the batch numbered 2 and the batch numbered 3, the conversion efficiencies are all raised and higher than 18 percent, the filling factors are all higher than 70 percent, and the filling factors after annealing are not decreased or slightly decreased when compared with those before annealing. Therefore, the cell sheets in the batch numbered 1, the batch numbered 2 and the batch numbered 3 meet the efficiency requirement liar the cell sheets after only one low temperature annealing process, and can be packaged and stored as efficient sheets without performing subsequent steps. While the filling factors of the cell sheets in the batch numbered 4 and the batch numbered 5 are significantly decreased when compared with those before the annealing, resulting in very small proportions of improvement or even decreases of the conversion efficiencies. Therefore, subsequent re-sintering and annealing processes should be performed on the fourth batch and the fifth batch of cell sheets. The cell sheets in the batch numbered 4 and the batch numbered 5 after re-sintering are tested and the test results are shown in Table 3.

TABLE 3 table listing the electrical parameters of the batches of inefficient sheets numbered 4-5 after re-sintering

| Batch number of the cell sheets | Open-circuit voltage Voc (volt) | Short-circuit current Isc (ampere) | Series resistance Rs (ohm) | Filling Factor FF (%) | Conversion efficiency Ncell |
|---|---|---|---|---|---|
| 4 | 0.5997 | 8.802 | 0.0039 | 76.30 | 16.85 |
| 5 | 0.6076 | 8.689 | 0.0027 | 78.53 | 17.35 |

As can be found from Table 3, the filling factors of the cell sheets in the batch numbered 4 and the batch numbered 5 after re-sintering are significantly improved. However, the Voc, Isc, and the conversion efficiencies are decreased. Therefore the annealing process should be performed on the two batches of cell sheets again. Performance test results after re-annealing are shown in Table 4.

TABLE 4 table listing the electrical parameters of the inefficient sheets in batches numbered 4-5 after re-annealing

| Batch number of the cell sheets | Open-circuit voltage Voc (volt) | Short-circuit current Isc (ampere) | Series resistance Rs (ohm) | Filling Factor FF (%) | Conversion efficiency Ncell |
|---|---|---|---|---|---|
| 4 | 0.6335 | 9.167 | 0.0051 | 76.10 | 18.49 |
| 5 | 0.6367 | 9.092 | 0.0038 | 77.45 | 18.76 |

As can be found from the table above, the conversion efficiencies of the cell sheets in the batch numbered 4 and the batch numbered 5 are all raised and higher than 18 percent, the filling factors thereof are all higher than 70 percent, and the filling factors after annealing are slightly decreased when compared with those before annealing. Therefore, the two batches of cell sheets also meet the requirement for the efficiencies of the cell sheets, and can be packaged and stored as efficient sheets without further performing the sintering and annealing processes.

Generally, for the monocrystalline silicon solar cells with anti-reflection films on both the front surfaces and the back surfaces, the conversion efficiencies of most of the inefficient sheets may be greatly enhanced after the above processes. If there still exist inefficient sheets which do not meet the requirement, the sintering and annealing processes may be further performed.

As a comparative example, processing results of a batch of N-type monocrystalline silicon solar cells with no antireflection films on the back surfaces are provided hereinafter. In addition to the absence of the antireflection films on the back surfaces of the cell sheets, other parameters of the batch of cell sheets are same as those of the foregoing five batches of cell sheets. The processing results are shown in Table 5.

TABLE 5 table listing the electrical parameters of the inefficient sheets with no antireflection films on the back surfaces before and after annealing

| Inefficient sheets with no antireflection film on the back surfaces | Open-circuit voltage Voc (volt) | Short-circuit current Isc (ampere) | Series resistance Rs (ohm) | Filling Factor FF (%) | Conversion efficiency Ncell |
|---|---|---|---|---|---|
| After normal sintering | 0.6014 | 7.947 | 0.0019 | 79.36 | 15.87 |
| After annealing | 0.6191 | 8.375 | 0.0036 | 77.44 | 16.80 |

As can be found from the table above, for the inefficient sheets with no antireflection films on the back surfaces, although the conversion efficiency is improved after one annealing process, the improvement is not obvious. Then the re-sintering and annealing processes and the like may be performed. Although the conversion efficiency of the cell sheets can be improved to an efficient level, the number of times for sintering and annealing processes is much bigger than that for processing the cell sheets with antireflection films on both the front surfaces and the back surfaces.

From the changes of the performance parameters of the inefficient sheets shown in the above processes, it is obvious that, with the method according to the embodiment of the disclosure, photoelectric conversion efficiencies of the cell sheets are further improved, and accordingly the economic benefit is improved.

A solar cell sheet manufactured with the heat treatment process described above is disclosed according to another embodiment of the disclosure. The solar cell sheet has a conversion efficiency higher than or equal to 18 percent and a filling factor higher than or equal to 70 percent. A base material of the solar cell sheet is monocrystalline silicon, and preferably N-type monocrystalline silicon. A hydrogen-rich antireflection film is provided on both a front surface and a back surface of the solar cell sheet. Therefore defects such as Oxidation-induced Stacking Fault (OSF) ring and gap, swirl of vacancy cluster and the like in the base material of the cell sheet are significantly decreased as compared to a conventional monocrystalline silicon solar cell. In addition, the solar cell sheet contains substantially no defect such as ring, dirty or the like and accordingly the conversion efficiency is improved.

The above-described are only preferred embodiments of the disclosure, which are not intended to limit the disclosure in any forms.

Although the preferred embodiments of the disclosure are disclosed as above, these embodiments are not intended to limit the disclosure. Many variations and modifications may be made to the technical solution of the disclosure, or equivalent embodiments may be modified from the technical solution of the disclosure by those skilled in the art based on the methods and the technical contents disclosed above without departing from the scope of the disclosure. Therefore, all contents that do not depart from the technical solution of the disclosure, and any simple alteration, equivalent variation and modification made to the embodiments based on the technical substance of the disclosure should all fall in the scope of protection of the disclosure.

The invention claimed is:
1. A heat treatment process for solar cell sheets, comprising:

a) sifting out, from solar cell sheets on which printing and sintering are performed, cell sheets with conversion efficiencies lower than 18 percent and filling factors higher than or equal to 70 percent;
b) performing low temperature annealing on the sifted cell sheets to improve the conversion efficiencies of the sifted cell sheets, wherein a temperature for the low temperature annealing is lower than that of the sintering;
c) performing a sorting test on the cell sheets on which the low temperature annealing is performed, to sift out cell sheets for which the filling factors are decreased;
d) re-sintering the cell sheets sifted out in step c) to increase the filling factors of the cell sheets, wherein a temperature for the re-sintering is same as that of the sintering; and
e) performing a sorting test on the re-sintered cell sheets to sift out the cell sheets with the conversion efficiencies lower than 18 percent and returning to step b), until most or all of the sifted cell sheets have the conversion efficiencies higher than 18 percent and have the filling factors higher than or equal to 70 percent.

2. The heat treatment process according to claim 1, wherein bases of the cell sheets are made of monocrystalline silicon, and the sifted cell sheets are solar cell sheets with low conversion efficiencies due to defects introduced in a process of drawing the monocrystalline silicon.

3. The heat treatment process according to claim 2, wherein before the printing and sintering, the heat treatment process further comprises:
a flocking process on surfaces of the cell sheets, a diffusion process for forming junctions and a plasma etching process at peripheries of the cell sheets;
wherein the diffusion process for forming the junctions comprises: performing diffusion on front surfaces of the cell sheets to form the junctions and performing diffusion on back surfaces of the cell sheets to form back surface fields.

4. The heat treatment process according to claim 3, wherein after the plasma etching process at the peripheries of the cell sheets, the heat treatment process further comprises: an antireflection film depositing process and an electrode printing process;
wherein the antireflection film depositing process comprises successively depositing antireflection films on both the front surfaces and the back surfaces of the cell sheets.

5. The heat treatment process according to claim 4, wherein the bases for manufacturing the cell sheets are made of N-type monocrystalline silicon.

6. The heat treatment process according to claim 5, wherein a duration for the low temperature annealing ranges from 30 seconds to 4 minutes.

7. The heat treatment process according to claim 6, wherein the temperature for the low temperature annealing ranges from 250 Celsius degrees to 550 Celsius degrees.

8. The heat treatment process according to claim 7, wherein the antireflection film comprises at least one of hydrogen-rich silicon nitride thin film, hydrogen-rich silicon oxynitride thin film, and hydrogen-rich titanium nitride thin film.

9. The heat treatment process according to claim 1, wherein the low temperature annealing process is performed in a non-oxidizing atmosphere.

* * * * *